United States Patent
Lederer et al.

(10) Patent No.: US 10,468,601 B2
(45) Date of Patent: Nov. 5, 2019

(54) CHARGE TRANSPORTING SEMI-CONDUCTING MATERIAL AND ELECTRONIC DEVICE COMPRISING IT

(71) Applicant: Novaled GmbH, Dresden (DE)

(72) Inventors: Kay Lederer, Dresden (DE); Steffen Runge, Dresden (DE); Felix Limberg, Munich (DE); Hartmut Krueger, Munich (DE)

(73) Assignee: Novaled GmbH, Dresden (DE)

( * ) Notice: Subject to any disclaimer, the term of this patent is extended or adjusted under 35 U.S.C. 154(b) by 30 days.

(21) Appl. No.: 15/438,378

(22) Filed: Feb. 21, 2017

(65) Prior Publication Data

US 2017/0244033 A1    Aug. 24, 2017

(30) Foreign Application Priority Data

Feb. 22, 2016  (EP) ..................... 16156693

(51) Int. Cl.
| | |
|---|---|
| H01L 51/00 | (2006.01) |
| C09D 5/24 | (2006.01) |
| C08F 212/14 | (2006.01) |
| C09D 125/18 | (2006.01) |
| H01L 51/50 | (2006.01) |
| C08G 73/08 | (2006.01) |

(52) U.S. Cl.
CPC .......... *H01L 51/004* (2013.01); *C08F 212/14* (2013.01); *C09D 5/24* (2013.01); *C09D 125/18* (2013.01); *H01L 51/0043* (2013.01); *C08G 73/08* (2013.01); *H01L 51/0007* (2013.01); *H01L 51/0067* (2013.01); *H01L 51/0095* (2013.01); *H01L 51/506* (2013.01); *H01L 2251/533* (2013.01)

(58) Field of Classification Search
None
See application file for complete search history.

(56) References Cited

U.S. PATENT DOCUMENTS

2013/0112921 A1* 5/2013 Stoessel ................ C07C 49/796
252/301.35

FOREIGN PATENT DOCUMENTS

WO    2014/037512 A2    3/2014

OTHER PUBLICATIONS

European Search Report for EP Application No. 16 15 6693 dated Aug. 22, 2016 (7 pages).
Ossipov, et al. "Poly(vinyl alcohol)-Based Hydrogels Formed by 'Click Chemistry,'" Macromolecules, 2006, 39:1709-1718.

(Continued)

*Primary Examiner* — Mark Kopec
(74) *Attorney, Agent, or Firm* — Eversheds Sutherland (US) LLP

(57) ABSTRACT

The present invention relates to a charge transporting semi-conducting material. The charge transporting semi-conducting material may include
  optionally at least one electrical dopant, and
  a branched or cross-linked charge transporting polymer that includes 1,2,3-triazole cross-linking units of at least one of the general formulae Ia and/or Ib herein.
The charge transporting polymer can include ethylene building units substituted with at least one pending side group including a conjugated system of delocalized electrons. Also provided herein are processes for obtaining the charge transporting semi-conducting material.

31 Claims, 1 Drawing Sheet

(56) References Cited

OTHER PUBLICATIONS

Park et al., "Facile Photo-Crosslinking of Azide-Containing Hole-Transporting Polymers for Highly Efficient, Solution-Processed, Multilayer Organic Light Emitting Devices," Adv. Funct. Mater., 2014, 24:7588-7596.

* cited by examiner

CHARGE TRANSPORTING SEMI-CONDUCTING MATERIAL AND ELECTRONIC DEVICE COMPRISING IT

This application claims priority to European Application No. 16156693.0, filed Feb. 22, 2016, which is incorporated herein by reference.

The present invention relates to a charge transporting semi-conducting material, a method for its preparation and a semiconducting device comprising the material.

Since the demonstration of low operating voltages by Tang et al., 1987 [C. W. Tang et al. Appl. Phys. Lett. 51 (12) 913 (1987)], organic light-emitting diodes have been promising candidates for the realization of large-area displays. They consist of a sequence of thin (typically 1 nm to 1 µm) layers of organic materials, which can be produced by vacuum deposition, by spin-on deposition or by deposition from solution in their polymer form. After electrical contacting by metallic layers they form a great variety of electronic or optoelectronic components, such as for example diodes, light-emitting diodes, photodiodes and thin film transistors (TFT), which, in terms of properties, compete with established components based on inorganic layers.

In the case of organic light-emitting diodes (OLEDs), light is produced and emitted by the light-emitting diode by the injection of charge carriers (electrons from one side, holes from the other) from the contacts into adjacent organic layers as a result of an externally applied voltage, subsequent formation of excitons (electron-hole pairs) in an active zone, and radiant recombination of these excitons.

The advantage of such organic components as compared with conventional inorganic components (semiconductors such as silicon, gallium arsenide) is that it is possible to produce large-area elements, i.e., large display elements (visual displays, screens). Organic starting materials, as compared with inorganic materials, are relatively inexpensive (less expenditure of material and energy). Moreover, these materials, because of their low processing temperature as compared with inorganic materials, can be deposited on flexible substrates, what opens up a whole series of new applications in display and illuminating engineering.

The basic construction of such a component includes an arrangement of one or more of the following layers:
1. Carrier, substrate
2. Base electrode, hole-injecting (positive pole), usually transparent
3. Hole-injecting layer
4. Hole-transporting layer (HTL)
5. Light-emitting layer (EL)
6. Electron-transporting layer (ETL)
7. Electron-injecting layer
8. Cover electrode, usually a metal with low work function, electron-injecting (negative pole)
9. Encapsulation, to shut out ambient influences.

While the foregoing represents the most typical case, often several layers may be (with the exception of the $2^{nd}$, $5^{th}$ and $8^{th}$ layers) omitted, or else one layer may combine several properties. U.S. Pat. No. 5,093,698 discloses that the hole-conducting and/or the electron-conducting layer may be doped with other organic molecules, in order to increase their conductivity.

Organic photovoltaics (OPV) offer a big promise for the efficient and large scale conversion of light into electricity. The production of organic photovoltaic devices is less material demanding than the production of inorganic crystalline photovoltaic devices. The production also consumes considerably less energy than the production of any other inorganic photovoltaic device.

Efficiency of organic photovoltaic devices has been improving steadily. In 2008 a certified power conversion efficiency value of 5% was reached, and in 2010 the psychological barrier of 8% was broken, aligning the efficiency of the organic photovoltaic devices to typical values of amorphous Si devices.

OPV devices comprise at least one solar cell, or an arrangement of solar cells. Organic solar cells have the most different layer stack architectures. Typically they comprise at least one organic photovoltaic layer between two electrodes. That organic layer can be a blend of a donor and an acceptor such as P3HT (poly3-hexyl-tiophene) and PCBM (phenyl C61 Butyric Acid Methyl Ester). Such simple device structures only achieve reasonably efficiencies if interfacial injection layers are used to facilitate charge carrier injection/extraction (Liao et al., Appl. Phys. Lett., 2008. 92: p. 173303). Other organic solar cells have multi-layer structures, sometimes even hybrid polymer and small molecule structures. Also tandem or multi-unit stacks are known (U.S. Pat. No. 7,675,057, or Ameri, et al., Energy & Env. Science, 2009. 2: p. 347). Multi-layer devices can be easier optimized since different layers can comprise different materials which are suitable for different functions. Typical functional layers are transport layers, optically active layers, injection layers, etc.

The use of doped charge-carrier transport layers (p-doping of the HTL by admixture of acceptor-like molecules, n-doping of the ETL by admixture of donor-like molecules) is described in U.S. Pat. No. 5,093,698. Doping in this sense means that the admixture of doping substances into the layer increases the equilibrium charge-carrier concentration in this layer, compared with the pure layers of one of the two substances concerned, which results in improved conductivity and better charge-carrier injection from the adjacent contact layers into this mixed layer. The transport of charge carriers still takes place on the matrix molecules. According to U.S. Pat. No. 5,093,698, the doped layers are used as injection layers at the interface to the contact materials, the light-emitting layer being found in between (or, when only one doped layer is used, next to the other contact). Equilibrium charge-carrier density, increased by doping, and associated band bending, facilitate charge-carrier injection. The energy levels of the organic layers (HOMO=highest occupied molecular orbital or highest energetic valence band energy; LUMO=lowest unoccupied molecular orbital or lowest energetic conduction band energy), according to U.S. Pat. No. 5,093,698, should be obtained so that electrons in the ETL as well as holes in the HTL can be injected into the EL (emitting layer) without further barriers, which requires very high ionization energy of the HTL material and very low electron affinity of the ETL material.

An important property of organic semi-conducting devices is their conductivity. By electrical doping, the conductivity of a layer of an organic semi-conducting device can be significantly increased. The conductivity of a thin layer sample can be measured by, for example, the so called two-point method. At this, a voltage is applied to the thin layer and the current flowing through the layer is measured. The resistance, respectively the conductivity, results by considering the geometry of the contacts and the thickness of the layer of the sample.

In fields of organic electronics, several different functional organic layers have to be formed on top of each other to produce an electronic device. The function of the device results from the optimized interaction of the stacked layers and their interfaces. In general, there are two different approaches for preparing these layers and interfaces. First, vacuum deposition and, second, coating of the functional material from a solution on the top of substrate or of another layer prepared before.

From these technologies, solution processes gain rising attention due to their potential for a high throughput mass production and lower costs in comparison with high vacuum technologies.

When using solution processes, there is the challenge of avoiding damage or dissolving previous organic layer or any other undesirable changes of its properties by depositing another layer on top of it from a solvent. Besides the so called "orthogonal solvent" approach, crosslinking of the previous organic layer is a possibility to prevent damaging, dissolving or changing of the layer.

A previous application published as WO2014/037512 and incorporated herein by the reference describes successful combination of azide+acetylene cycloaddition crosslinking with electrical doping.

It is an object of the present invention to provide cross-linked charge transporting semiconducting materials with improved properties, intermediates and process for the preparation of such improved materials, and devices exploiting the improved material for better performance This object has been achieved by a charge transporting semi-conducting material comprising:
a) optionally at least one electrical dopant, and
b) at least one cross-linked charge-transporting polymer comprising 1,2,3-triazole crosslinking units of at least one of the general formulae Ia and/or Ib,

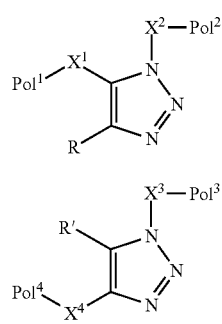

wherein
aa) $Pol^1$-$Pol^4$ are independently selected chains of the charge-transporting polymer,
bb) $X^1$, $X^2$, $X^3$, and $X^4$ are independently selected spacer units or, independently, represent direct bonding of the Pol chains to the 1,2,3-triazole ring,
cc) each of R and R' is independently selected from H, halogen or a carbon-containing group,
wherein the charge transporting polymer comprises ethylene building units substituted with at least one pending side group comprising a conjugated system of, preferably at least 6, more preferably at least 10, delocalized electrons,
the charge transporting semi-conducting material being obtainable by a process comprising:
i) providing a solution containing
aaa) a first precursor charge transporting polymer comprising at least one covalently attached azide group and optionally at least one acetylenic group; and/or a second precursor charge transporting polymer comprising at least one covalently attached acetylenic group and optionally at least one azide group; and optionally at least one cross-linking agent comprising at least two functional groups selected from azide and/or acetylenic group,
bbb) optionally at least one electrical dopant,
ccc) at least one solvent,
ii) depositing the solution on a substrate,
iii) removing the solvent, and
iv) reacting the azide and acetylenic groups to effect crosslinking, preferably by heating,
wherein at least one of the first and second precursor charge transporting polymer comprises ethylene building units substituted with at least one pending side group comprising a conjugated system of, preferably at least 6, more preferably at least 10, delocalized electrons.

Preferably, R and R' are independently selected from H and a substituent selected from halogen, nitrile, $C_1$-$C_{22}$ saturated or unsaturated alkyl, $C_3$-$C_{22}$ cycloalkyl, $C_6$-$C_{18}$ aryl, $C_7$-$C_{22}$ arylalkyl, $C_2$-$C_{13}$ heteroaryl having up to three heteroatoms, independently selected from oxygen, nitrogen and sulphur, $SiR^1R^2R^3$, wherein $R^1$, $R^2$ and $R^3$ are independently selected from $C_1$-$C_4$ alkyl or phenyl, $COR^4$ or $COOR^5$, wherein $R^4$ and $R^5$ are independently selected from $C_1$-$C_{22}$ alkyl or $C_7$-$C_{22}$ arylalkyl, $CR^6R^7OR^8$, wherein $R^6$ and $R^7$ are independently selected from H, $C_1$-$C_6$ alkyl, $C_6$-$C_9$ aryl or $R^6$ and $R^7$ together form a $C_3$-$C_7$ ring, and $R^8$ is $C_1$-$C_6$ alkyl, $C_7$-$C_{22}$ arylalkyl, $SiR^9R^{10}R^{11}$, wherein $R^9$, $R^{19}$, and $R^{11}$ are independently selected from $C_1$-$C_4$ alkyl or phenyl, or $COR^{12}$, wherein $R^{12}$ is H or $C_1$-$C_{21}$ alkyl.

The groups from which R and R' can be selected can be optionally substituted by alkyl, cycloalkyl, aryl, heteroaryl or arylalkyl, in which the number of C-atoms, stated under cc), includes the number of C-atoms of the substituents, and, in case that R and R' are selected from alkyl, cycloalkyl, aryl, heteroaryl or arylalkyl, the group can be, optionally, partially or fully substituted with halogen atoms.

Preferably, the average number of azide and/or acetylenic groups per molecule in each the first precursor charge transporting polymer, the second precursor charge transporting polymer and the crosslinking agent is greater than 2, preferably greater than 2.05.

More preferably, the average number of azide and/or acetylenic groups per molecule in each the first precursor charge transporting polymer, the second precursor charge transporting polymer and the crosslinking agent is equal to or greater than 3. Even more preferably, the charge transport polymer comprises only the first precursor charge transporting polymer and the second precursor charge transporting polymer. Most preferably, each of the first precursor charge transporting polymer and the second precursor charge transporting polymer has the average number of azide and/or acetylenic groups per molecule at least 5.

The electrical dopant is being understood as a compound introduced in a semi-conductor for the purpose of modulating its electrical properties, preferably for increasing its conductivity.

Preferably, the electrical dopant is a redox dopant which creates in the doped semiconducting material free charge carrier having character of ion radicals (holes) by means of redox reaction (charge transfer) with the charge transporting matrix. In the preferred case that the dopant is a redox p-dopant, the charge carrier has character of a cation radical (hole) and charge carrier transport is hole transport.

The strength of redox dopants can be compared e.g. in terms of their electrochemical redox potential, which can be measured by cyclic voltammetry in presence of a reference redox system, for example $Fc/Fc^+$. Details of cyclovoltammetry and other methods to determine reduction potentials and the relation of the ferrocene/ferrocenium reference couple to various reference electrodes can be found in A. J. Bard et al., "Electrochemical Methods: Fundamentals and Applications", Wiley, 2. Edition, 2000.

A spacer unit in terms of the present invention is a structural moiety enabling connection of two molecular groups, preferably via covalent bonding. In general, any covalent structure, stable enough to withstand conditions of crosslinking process, can be used as a spacer unit. The term "structural moiety" is used for any part of a more complex chemical structure.

Preferably, spacer units having up to 30 multivalent atoms can be used. Even more preferred, the spacer unit is a molecular group only comprising covalent bonds. The spacer having up to 30 multivalent atoms does not need to contribute itself to the charge-transporting properties of the charge transporting semi-conducting material. Spacer units comprising more than 30 multivalent atoms can be preferably used, in case that the spacer unit comprises a system of conjugated π orbitals to allow charge transfer along the spacer unit. In this case, the spacer unit can basically work in the doped semiconducting material of the invention not only in the role of a tether linking the charge transporting polymer Pol with the triazole crosslinking unit, but, at once, together with Pol in the role of a charge transporting matrix without any substantial limitation in the spacer length. Multivalent in this regard means a valence higher than one. Hydrogen and alkali metals are regarded as every time monovalent, the valence of other elements depends on their bonding in the spacer in each specific case.

The overall amount of the spacer unit in the charge transporting semi-conducting material should not exceed 90% by weight, preferably 80% by weight, most preferably 50% by weight, with regard to the overall weight of the charge transporting semi-conducting material.

Saturated alkyl comprises all linear and branched alkyl groups, only containing carbon-carbon single bonds. Unsaturated alkyl is a linear or branched hydrocarbon group comprising at least one carbon-carbon double bond.

Cycloalkyl in terms of the present invention includes all cyclic and polycyclic carbon structures, which can optionally also contain unsaturated bonds with exception of aromatic systems (aryls).

The term aryl includes also aryl groups substituted by alkyl groups, like tolyl, xylyl, etc. It further includes all kind of condensed aromatic systems like naphthyl, antracene-yl, phenanthrene-yl and aryl substituted aryls like 1,1'-biphenyl-4-yl.

Halogen means F, Cl, Br and I.

Cross-linking in terms of the present invention means to link polymer chains to form an infinite structure, preferably by new covalent bonds forming new (crosslinking) structural moieties (crosslinking units). Basically, it is necessary to have at least two crosslinkable reactive groups per polymer molecule in the crosslinking reaction mixture, to be able to achieve a continuous infinite network during crosslinking reaction from starting molecules linked together with new crosslinking units formed from the starting crosslinkable reactive groups. The term "infinite" means that the network forms a huge polymer molecule which size is only limited by the total amount of precursor materials. The higher the average number of the reactive groups per molecule, the lower the conversion of functional groups to crosslinking groups, needed to form the infinite network (gelation point). A person skilled in the art will be aware that an increased number of cross-linking units in the cross-linked charge transporting material can be particularly advantageous to achieve a layer of high stability, especially of high resistance against damage by any solvent used in processing of an adjacent layer.

In the crosslinked charge transporting polymer according to the invention, binding of each crosslinking triazole unit can be to the same molecule or to different chains of the charge transporting polymer Pol. Each Pol chain is bound at least to one triazole crosslinking unit. If the charge transporting polymer according to the invention does not form an infinite structure, the average number of the Pol chains linked directly or through the spacer to one crosslinking triazole group as well as the average number of the crosslinking triazole groups connected directly or through the spacer to one Pol chain are less than two. Such charge transporting polymer is branched but not yet crosslinked.

A charge transporting polymer in terms of the present invention is a polymer capable to transport an injected charge owing to a system of overlapping orbitals along the polymer chain. In charge transporting polymers of the present invention, the overlapping orbitals are preferably orbitals of the atoms contained in the pending side groups along the polymeric backbone. Injecting charge (either in form of electron injected or withdrawn by an electrode in contact with the polymer or through a reaction with a proper electrical dopant) can, thus, form a delocalized cation radical or anion radical, able to easily migrate through the polymeric material and thus create measurable currents if an electric voltage is applied.

Preferably, the conjugated system of delocalized electrons which is comprised in the pending side group, is comprised in a carbocyclic or heterocyclic structural moiety.

In one embodiment, the conjugated system of delocalized electrons comprised in the carbocyclic or heterocyclic structural moiety is aromatic. Preferably, the pending side group comprises at least two rings which are independently selected from aromatic and heteroaromatic rings.

In another embodiment, the pending side group comprises at least one trivalent nitrogen atom. Preferably, the trivalent nitrogen atom is substituted with three carbocyclic or heterocyclic rings which are independently selected from aromatic and heteroaromatic rings.

In one embodiment, the pending side group is selected from

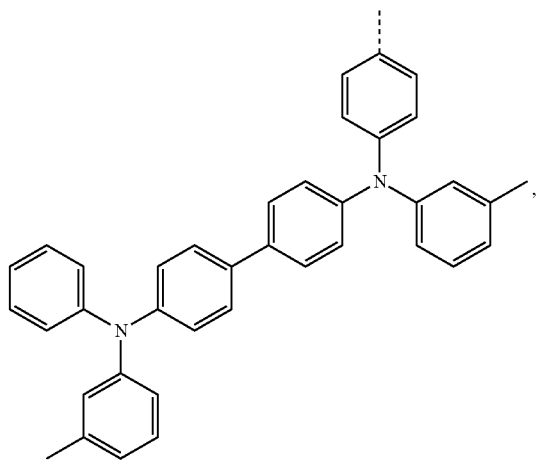

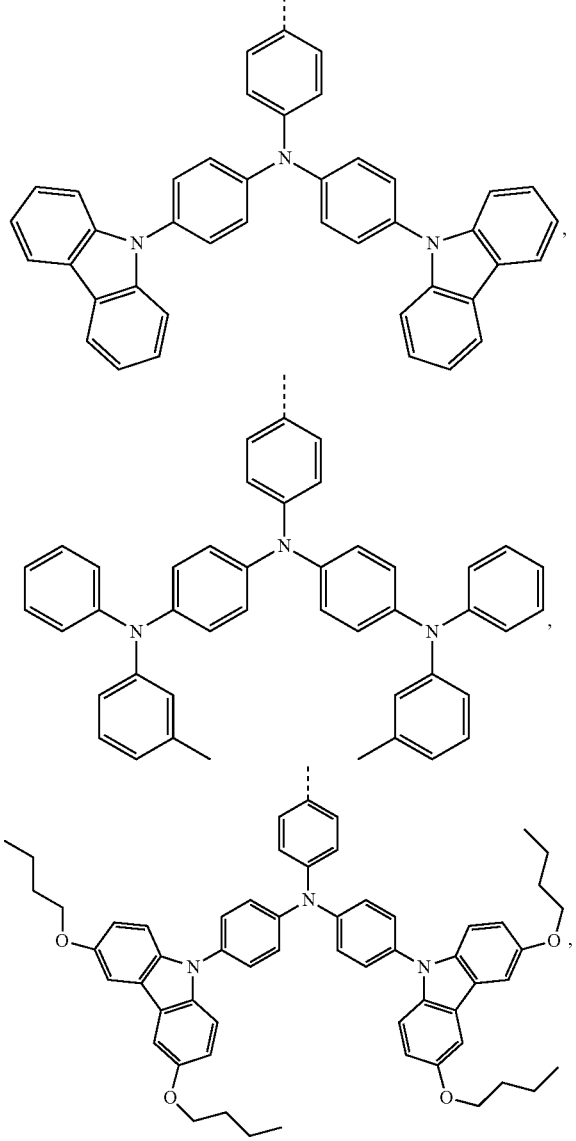

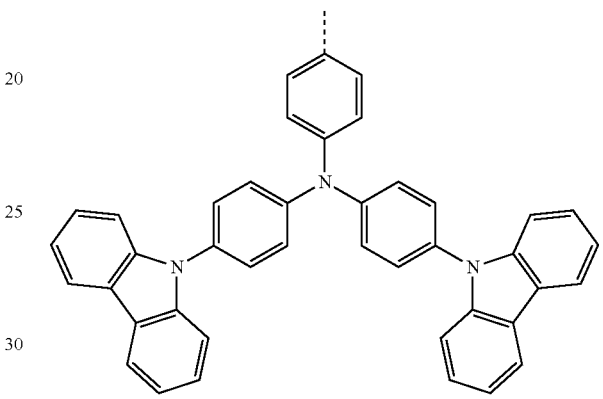

wherein the dashed lines in the given formulae represent the single bond to the ethylene building units.

Preferably, the charge transporting semi-conducting material has an electric conductivity higher than $10^{-10}$ S/cm, preferably higher than $10^{-8}$ S/cm, more preferably higher than $10^{-6}$ S/cm, most preferably higher than $10^{-4}$ S/cm.

The crosslinked charge transporting polymer comprising the crosslinking units of the general formulae Ia and/or Ib is obtainable by a process comprising cycloaddition reaction of azide groups —$N_3$ comprised and covalently bound in crosslinkable moieties A and complementary acetylenic groups —CC—R or —CC—R', where R and R' is as defined above, comprised and covalently bound in complementary crosslinkable moieties B.

In a preferred embodiment of the invention, at least crosslinkable moieties A or at least crosslinkable moieties B have character of a precursor charge transporting polymer. Precursor charge transporting polymer is a charge transporting polymer comprising crosslinkable azide and/or acetylenic groups. The precursor charge transporting polymer may be linear or branched, but may not be crosslinked, because crosslinking would have made it insoluble.

In one embodiment, the precursor charge transporting polymer is a first precursor charge transporting polymer comprising at least one covalently attached azide group and optionally at least one acetylenic group and having the pending side groups as defined above.

In another embodiment, the precursor charge transporting polymer is a second precursor charge transporting polymer comprising at least one covalently attached acetylenic group and optionally at least one azide group and having the pending side groups as defined above.

In an alternative embodiment, it is preferred that in the first precursor charge transporting polymer, the ethylene unit substituted with just one pending side group having formula is excluded.

It is preferred that at least one precursor charge transporting polymer is comprised in the mixture according to feature aaa) of the process by which the inventive charge transporting semiconducting material is obtainable.

A building unit in terms of the present invention is a structural unit repeating in the polymer chain. Any polymer chain can be formally obtained by linking its building units together successively, like the beads of a necklace.

The building units can be the same or different and can be present in the polymer in random or regular order as well as in blocks, containing a variety of the same building units.

It is further preferred that at least one of the complementary crosslinkable moieties A and B is at least partly represented by a compound having its average functionality, defined as the average number of reactive azide and/or alkyne crosslinkable groups per a molecule, selected from 2, 3 or 4. In this embodiment, the crosslinkable moiety can be polymer, e.g. a linear polymer having reactive azide or acetylene end groups, or a three- or four-arm-star polymer having one azide or acetylenic reactive end group at the end of each arm. Of course, if one of the complementary crosslinkable moieties A and B has the average functionality 2, then the average functionality of the complementary component must be higher than 2 to make crosslinking of such mixture theoretically possible. In fact, it is practically unavoidable that some divalent crosslinkable moieties form by reaction with their complementary multivalent counterparts cyclic or macrocyclic structures. It can generally result in terminating the chain of crosslinked moieties started on the surface of the sample before reaching the opposite side. That means, if one crosslinkable moiety has its average functionality exactly equal two and the average functionality of the complementary crosslinkable moiety is higher than two, it is practically still not sufficient for gelation of such mixture. It is therefore necessary that both complementary crosslinkable moieties have their average functionalities higher than two. In a preferred embodiment, both complementary crosslinkable moieties have their average functionalities higher than 2.05, more preferably, higher than 2.1.

On the other hand, it is obvious that if average functionality of any of the crosslinkable components A and B is higher than 2, not all available reactive azide and acetylene groups must necessarily convert into crosslinking triazole groups for achieving the desired infinite crosslinked network.

It is preferred that the degree of polymerization (defined as the average number of structural units in a polymer chain) of the charge transporting precursor polymer is in the range 10-10,000, more preferably in the range 20-1,000, most preferably in the range 30-500.

In one embodiment, the charge transporting precursor polymer or oligomer can be prepared by copolymerization or co-oligomerization of monomers bearing vinyl groups. In this case, resulting precursor polymers or oligomers have polyethylene or oligoethylene backbone, wherein the ethylene building units may be substituted with charge transporting structural moieties and/or crosslinking azide and/or acetylenic groups.

It is to be understood that the term substituted ethylene building units comprises e.g. phenylethylene building units which can be formed from styrene monomer. Analogously, polymers or oligomers comprising ethylene building units bearing substituents attached through a phenylene group can be prepared by addition reactions (polymerizations or oligomerizations) of styrene monomers having substituted phenyl groups.

In the prepared charge transporting semiconducting material of the present invention, the charge transporting polymer of the present invention is preferably crosslinked, in other words, it is comprised in the charge transporting semiconducting material in form of a continuous polymeric network.

In one preferred embodiment, the average number of azide and/or acetylenic groups per molecule in each the first precursor charge transporting polymer, the second precursor charge transporting polymer and the crosslinking agent is equal to or greater than 3. More preferably, the crosslinked charge transporting polymer is the polymer obtainable by reaction of the first precursor charge transporting polymer and of the second precursor charge transporting polymer. Even more preferably, each of the first precursor charge transporting polymer and the second precursor charge transporting polymer has the average number of azide and/or acetylenic groups per molecule at least 5.

In a crosslinked polymer formed from preferred charge transporting precursor polymers, there can be various amounts of structural units containing unreacted crosslinkable azide and acetylenic groups, represented by unchanged building units of the corresponding precursor charge transporting polymer.

In case of redox p-doping, the conductivity is provided as a result of electron transfer from HOMO of the host (hole transporting material) to the LUMO of the dopant. A suitable electrical p-dopant is generally a molecule or radical with a LUMO level equal to HOMO of the host or below it. In some cases, electrical p-dopants having LUMO level slightly above the HOMO level of the host are also applicable, but the difference of frontier orbital energies in these cases should not be higher than 0.5 eV, preferably not higher than 0.3 eV. The dopant can be neutral or electrically charged.

One class of preferred p-dopants are hexaazatriphenylene compounds. A very desirable compound for use in the p-doped organic semiconducting materials is HAT-1.

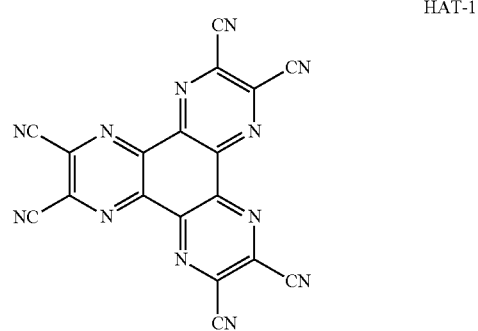 [SMILES: N#Cc1nc2c3nc(C#N)c(C#N)nc3c3nc(C#N)c(C#N)nc3c2nc1C#N]

HAT-1

Another suitable class of preferred p-dopants are fluorinated derivatives of cyanobenzoquinonedimethanes and cyanobenzoquinonediimines such as those described in EP1912268, WO2007/071450 and US20060250076. Specific examples of fluorinated derivatives of cyanobenzoquinonedimethanes and cyanobenzoquinonediimines include:

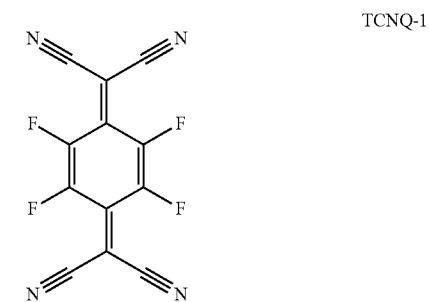

TCNQ-1

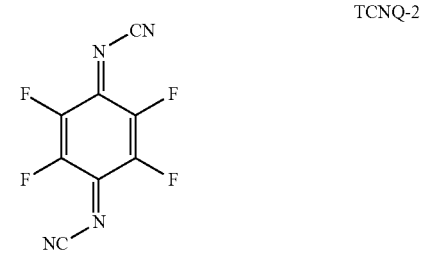

TCNQ-2

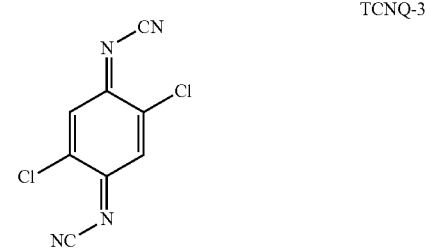

TCNQ-3

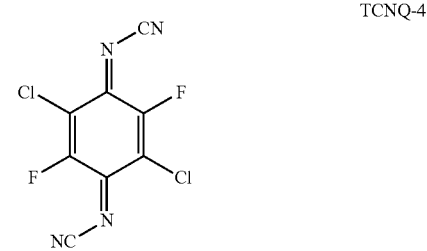

TCNQ-4

TCNQ-5

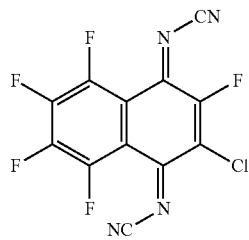

TCNQ-6

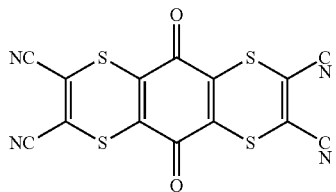

TCNQ-7

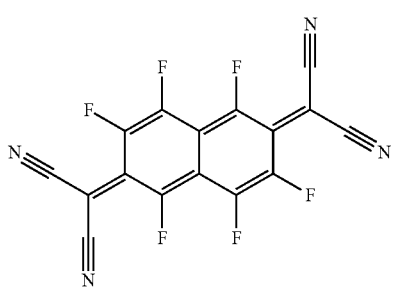

TCNQ-8

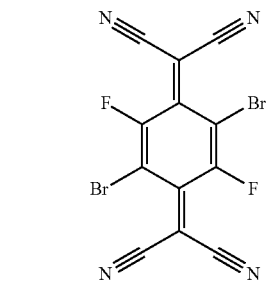

TCNQ-9

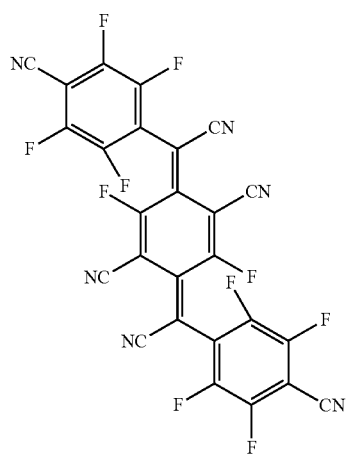

Yet another class of preferred p-dopants are radialenes such as those described in US20080265216, Iyoda et al, Organic Letters, 6(25), 4667-4670 (2004), JP3960131, Enomoto et al, Bull. Chem. Soc. Jap., 73(9), 2109-2114 (2000), Enomoto et al, Tet. Let., 38(15), 2693-2696 (1997) and Iyoda et al, JCS, Chem. Comm., (21), 1690-1692 (1989).

More preferably, the electrical dopant is selected from [3]-radialene compounds, wherein each bridgehead carbon atom is substituted by a nitrile group, $C_6$-$C_{14}$ perfluorinated aryl or $C_2$-$C_{14}$ perfluorinated heteroaryl, wherein up to three fluorine atoms in the perfluorinated substituents may optionally be replaced by groups independently selected from nitrile or trifluoromethyl.

Some illustrative examples of preferred [3]-radialenes include:

PR-1

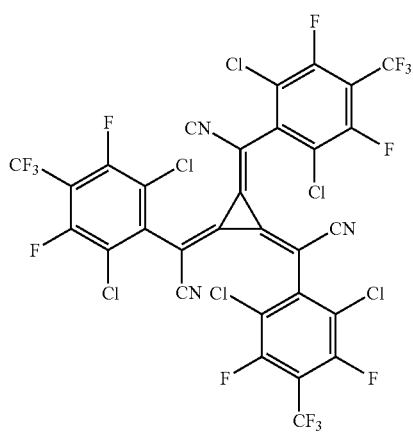

PR-2

PR-3

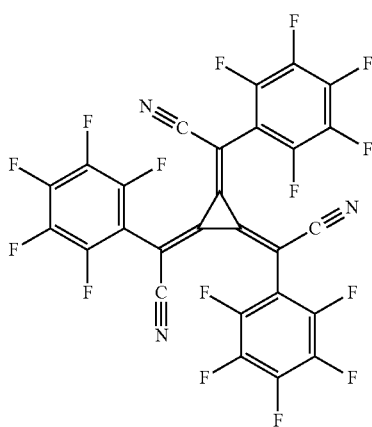

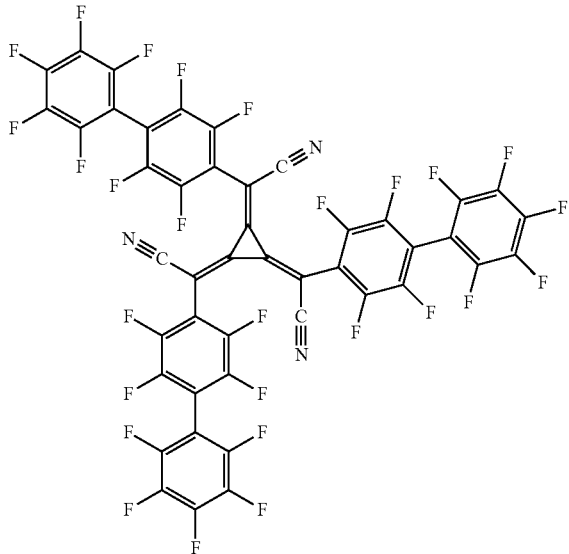

PR-4

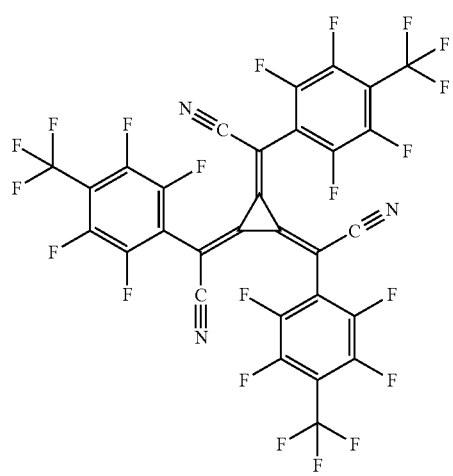

PR-5

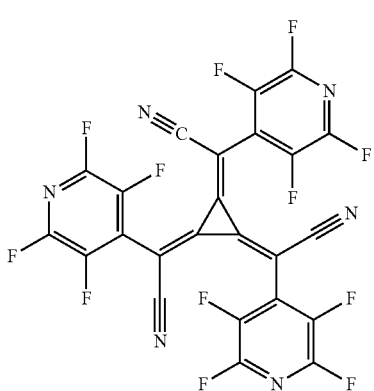

PR-6

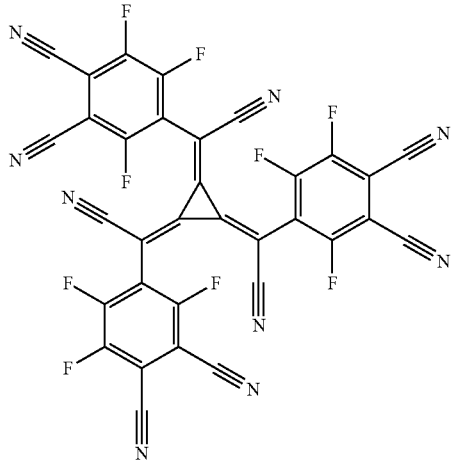

PR-7

These preferred compounds were disclosed e.g. in U.S. Pat. No. 8,057,712 B2 or prepared analogously as compounds disclosed therein.

Another class of suitable dopants represent complexes of metals having high oxidation state, e.g.:

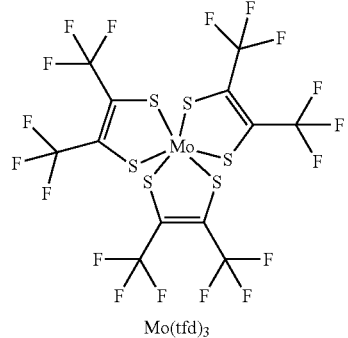

Mo(tfd)$_3$

Still another class of p-dopants are fullerene compounds substituted with electron withdrawing groups, as described in WO2010/029542, for example $C_{60}F_{48}$.

The object is further achieved by the inventive first precursor charge transporting polymer comprising at least one covalently attached azide group and optionally at least one acetylenic group, as defined above.

Moreover, the object is achieved by the inventive second precursor charge transporting polymer comprising at least one covalently attached acetylenic group and optionally at least one azide group having the inventive pending side group, as defined above.

Furthermore, the object is achieved by the inventive crosslinked charge transporting polymer having the inventive pending side group, as defined above.

More preferably, the average number of azide and/or acetylenic groups per molecule in each the first precursor charge transporting polymer, the second precursor charge transporting polymer and the crosslinking agent is equal to or greater than 3. Even more preferably, the crosslinked charge transport polymer comprises only the first precursor charge transporting polymer and the second precursor charge transporting polymer. Most preferably, each of the first precursor charge transporting polymer and the second precursor charge transporting polymer has the average number of azide and/or acetylenic groups per molecule at least 5.

The object is further achieved by a process for preparing an inventive charge transporting semi-conducting material comprising:
i) providing a solution containing
   a) a first precursor charge-transporting polymer comprising at least one covalently attacked azide group and optionally at least one acetylenic group; and/or a second precursor charge-transporting polymer comprising at least one covalently attached acetylenic group and optionally one azide group; and optionally at least one crosslinking agent comprising at least two functional groups selected from azide and/or acetylenic group,
   b) optionally at least one electrical dopant,
   c) at least one solvent,
ii) depositing the solution on a substrate,
iii) removing the solvent, and
iv) reacting the azide and acetylenic groups to effect crosslinking, preferably by heating,
wherein at least one of the first and second precursor charge transporting polymer comprises ethylene building units substituted with at least one pending side group comprising a conjugated system, preferably of at least 6 delocalized electrons.

In one preferred embodiment, the average number of azide and/or acetylenic groups per molecule in each the first precursor charge transporting polymer, the second precursor charge transporting polymer and the crosslinking agent is equal to or greater than 3. More preferably, the solution provided in step i) contains the first precursor charge transporting polymer, the second precursor charge transporting polymer, the solvent, and optionally at least one electrical dopant. Most preferably, each of the first precursor charge transporting polymer and the second precursor charge transporting polymer has the average number of azide and/or acetylenic groups per molecule at least 5.

Preferably, the material in step iii) before reaching the gelation point will be present in form of a solid or viscoelastic material before crosslinking in step iv). Also preferably, the material forms a homogeneous thin layer. Most preferably, the layer of non-crosslinked as well as of the crosslinked polymer is amorphous.

The term "viscous material" is related to a liquid having viscosity at 25° C. higher than 1 Pa·s. Viscoelastic materials are viscous liquids which in a sufficiently short timescale show, along with plasticity, also elastic deformation behaviour.

There can be one starting polymer comprising both complementary crosslinkable moieties A and B, but preferably, the complementary moieties A and B are comprised in two distinct components which are mixed together during the step i). In one embodiment, one of these separated components is a polymer precursor representing crosslinkable moieties A and another one represents crosslinkable moieties B. In another embodiment, crosslinkable moieties B are a polymeric precursor and crosslinkable moieties A represent the second component. Preferably, both crosslinkable moieties A and B are the charge transporting precursor polymers.

In another preferred embodiment, a charge transporting polymer precursor represents one kind of crosslinking moieties (either A or B), and the complementary moieties are used in the form of a low-molecular crosslinker, preferably one of compounds disclosed in the previous application WO2014/037512 under generic formula V.

The cycloaddition in step iv) of the inventive method is a [2+3] cycloaddition, also known as Huisgen-reaction, in which an azide group of the crosslinkable moiety A reacts with an acetylenic group of the crosslinkable moiety B under formation of a 1,2,3-triazole ring.

Preferably, the substrate in step ii) is a layer for use in an organic electronic device, more preferably a base electrode, a hole-injecting layer, a hole-transporting layer.

Basically any suitable solvent able to dissolve at least partly the first precursor charge transporting polymer, the second precursor charge transporting polymer, the crosslinking agent as well as the electrical dopant can be chosen. The solubility of the least soluble component should be at least 0.5 mg/ml. For preferred precursor charge transporting polymers containing preferred side groups as defined above, halogenated and/or aromatic hydrocarbon solvents like dichloromethane, dichloroethane, tetrachloroethane, chlorobenzene, toluene, xylene or anisol are suitable. More preferably, the solvent comprises at least 1 wt % of a nitrile compound.

In a preferred embodiment, heating in step iv) is heating to a temperature in a range from 60-160° C., preferably 80-140° C., most preferably 100-120° C.

The object is further achieved by a semiconducting device comprising a semi-conducting layer comprising the inventive charge transporting semi-conducting material. The layer comprising the inventive charge transporting semi-conducting material can be made by any conventional technique like spin coating or by a proper printing technique like jet printing, screen printing or offset printing.

The object is also achieved by an electronic device comprising the inventive semi-conducting layer comprising the inventive charge transporting semi-conducting material as defined above.

Furthermore, the object is achieved by a solution as defined in step i) of the inventive method containing
   a) a first precursor charge-transporting polymer comprising at least one covalently attached azide group and optionally at least one acetylenic group; and/or a second precursor charge-transporting polymer comprising at least one covalently attached acetylenic group and optionally one azide group; and optionally at least one crosslinking agent comprising at least two functional groups selected from azide and/or acetylenic group,
   b) at least one electrical dopant,
   c) at least one solvent,
   wherein at least one of the first and second precursor charge transporting polymer comprises ethylene building units substituted with at least one pending side group comprising a conjugated system of delocalized electrons and the solvent comprises at least 1 wt % of a nitrile compound.

Finally, the object is achieved by the use of the solution of the step i) of the inventive method for spin coating, printing, casting, slot-die coating, Langmuir-Blodgett (LB) deposition, in particular as an ink for jet-printing represented by solution of the step i) of the inventive process.

Surprisingly, it was found that the inventive charge transporting semi-conducting material solves the problem of the present invention due to easier and/or more complete crosslinking in comparison with the polymers of the cited previous application. This effect results in smaller leachable fraction in crosslinked layers, and particularly advantageously, in smaller leachable fraction of the dopant comprised in the crosslinked layers. This enables more robust and more reproducible manufacturing of electronic devices comprising polymeric charge transport layers, and improves the quality of prepared devices.

In the following, the invention will be described in further detail, by the way of examples.

EXAMPLES

Figure 1:
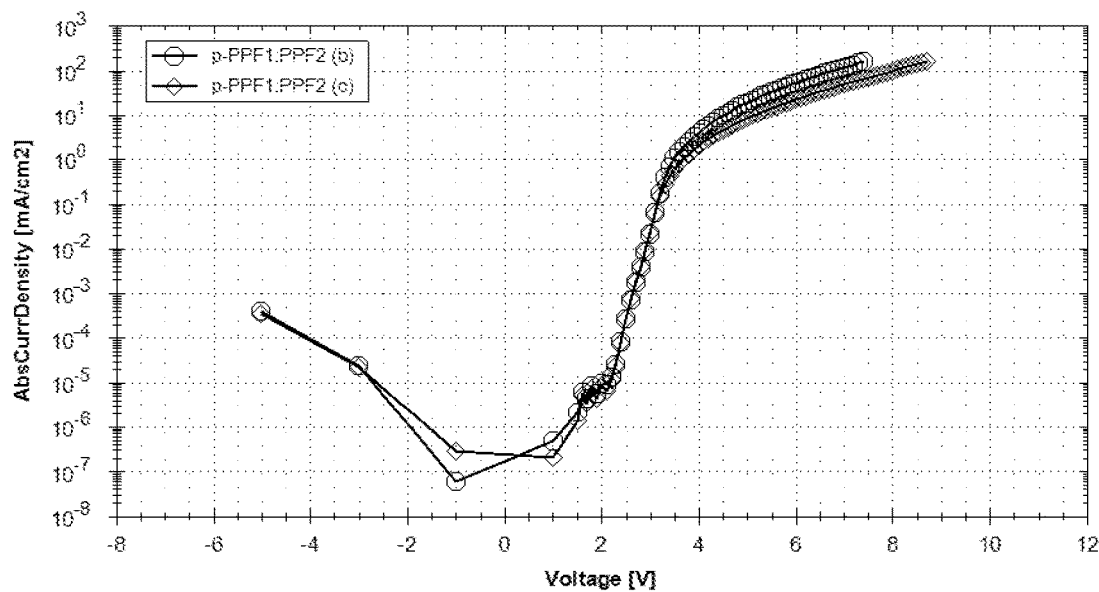
FIG. 1: Current density of the blue OLED in dependence on the voltage.

Exemplary semiconducting material for comparison with semiconducting materials comprising main-chain charge transport polymer of the previous application WO 2014/037512 was prepared from precursor polymers PPF1 and PPF2

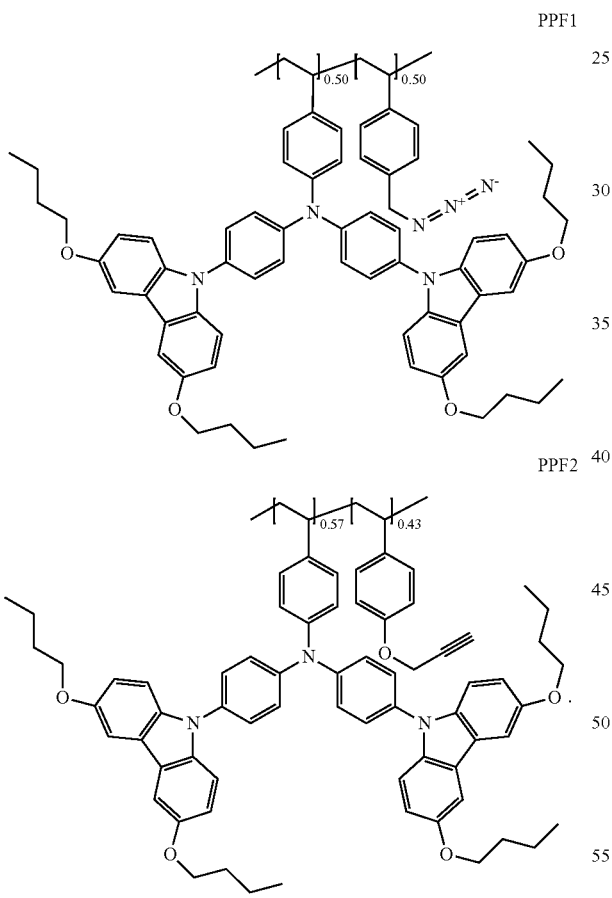

General Methods.

Gel permeation chromatography (GPC) measurements of polymer molecular weights were carried out on Agilent 1100 Series (Agilent, USA) normal-temperature size exclusion chromatograph, equipped with a refractive index detector and one column PL Gel MIXED-B (Polymer Laboratories, U.K.); the eluent was tetrahydrofuran (THF), and the flow rate was 1 mL/min. Number-average molecular weights ($M_n$) and polydispersity indexes (PDI) of the obtained polymers were determined based on calibration with polystyrene standards obtained from Polymer Standards Service (PSS, Germany).

Starting Materials for Polymer Preparation 1-(azidomethyl)-4-vinylbenzene (1)

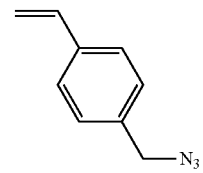

5.00 g 1-(chloromethyl)-4-vinylbenzene (32.8 mmol, 1.00 eq), 6.40 g (98.7 mmol, 3.00 eq) natrium azide and 0.52 g (1.40 mmol, 0.04 eq) dicyclohexyl-18-crown-6 were suspended in absolute N,N-dimethylformamide (DMF) and stirred for 24 h at room temperature (RT). The solvent was then removed on rotary evaporator, the mixture suspended in 100 mL diethyl ether and extracted three times with 50 mL brine. After drying over anhydrous sodium sulfate, the ether solution was evaporated with silica and the obtained material was filled in a chromatographic column and eluted with n-heptane/ethyl acetate gradient. Vacuum evaporation of the combined eluate gave the desired product in form of clear colourless oil.

Yield: 4.80 g (30.2 mmol, 92%)

IR (ATR, cm$^{-1}$) 2928; 2875; 2090; 1629; 1512; 1444; 1406; 1343; 1249; 1204; 1116; 1017; 989; 909; 847; 821; 766; 720; 669; 558

$^1$H NMR (500 MHz; chloroform-d) [ppm] δ 7.41 (dd, J=8.2 and 1.9 Hz, 2H); 7.26 (dd, J=8.2 and 1.6 Hz, 2H); 6.71 (ddd; J=17.7, 10.9 and 2.1 Hz, 1H); 5.76 (ddd, J=17.6, 2.5 and 0.9 Hz, 1H); 5.27 (ddd, J=10.9, 2.4 and 0.9 Hz, 1H); 4.30 (s, 2H).

1-(prop-2-in-1-yloxy)-4-vinylbenzene (2)

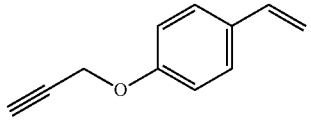

A solution of 11.0 g propargyl bromide (92.6 mmol, 1.50 equiv), 7.41 g 4-vinylphenol (freshly freed of the stabilizer, 61.7 mmol, 1.00 eq) and 10.4 g (185 mmol; 3.00 eq) KOH in 50 mL water and 120 mL acetone was stirred for 48 h at RT. The reaction mixture was then diluted with 100 mL ethyl acetate, extracted five times with 50 mL brine, dried over Na$_2$SO$_4$, filtered, the filtrate evaporated with silica and the resulting material column-eluted with n-heptane/ethyl acetate gradient. Vacuum evaporation of the combined eluate gave the desired product in form of clear yellowish oil.

Yield: 7.81 g (49.4 mmol, 80%)

IR (ATR, cm$^{-1}$) 3275; 2923; 2132; 1816; 1628; 1603; 1574; 1508; 1452; 1410; 1372; 1321; 1302; 1226; 1178; 1119; 1017; 971; 906; 834; 740; 704; 674; 570

$^1$H NMR (500 MHz; chloroform-d) [ppm] δ 7.42-7.29 (m, 2H); 6.99-6.86 (m, 2H); 6.65 (dd, J=17.6 and 10.9 Hz, 1H);

5.61 (dd, J=17.6 and 0.9 Hz, 1H); 5.13 (dd, J=10.9 and 0.9 Hz, 1H); 4.66 (d, J=2.4 Hz, 2H); 2.50 (t, J=2.4 Hz, 1H)

3,6-dibutoxy-9H-carbazole (3)

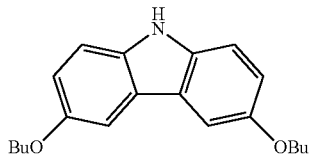

At RT, 57 mL absolute 1-butanol (154 mmol, 10.0 eq) were dropwise added under stirring to a suspension 11.1 g NaH (460 mmol, 10.0 eq) in dry DMF. After gas release ceased, the mixture was stirred for an additional hour and the resulting sodium butanolate solution was then, under inert atmosphere, added to a suspension 35.0 g CuI (18.0 mmol, 4 eq) in 50 mL dry DMF. The reaction mixture has been stirred at 120° C. for 1 h, filtered through diatomaceous earth and evaporated with silica. Column elution with n-hexane/ethyl acetate gradient afforded, after eluate evaporation, the desired product as a white solid.

Yield: 12.3 g (39.5 mmol, 86%)

$^1$H NMR (500 MHz; THF-$d_8$) [ppm] δ 9.81 (s, 1H); 7.51 (d, J=2.4 Hz, 2H); 7.23 (dd, J=8.8 and 0.5 Hz, 2H); 6.94 (dd, J=8.7 and 2.4 Hz, 2H); 4.04 (t, J=6.5 Hz, 4H); 1.88-1.75 (m, 4H); 1.65-1.47 (m, 4H); 1.01 (t, J=7.4 Hz, 6H)

$^{13}$C NMR (126 MHz; chloroform-d) [ppm] δ 153.2; 135.4; 123.9; 115.9; 111.5; 104.1; 68.9; 31.74; 19.5; 14.1

4-(bis(4-(3,6-dibutoxy-9H-carbazol-9-yl)phenyl)amino)benzaldehyde (4)

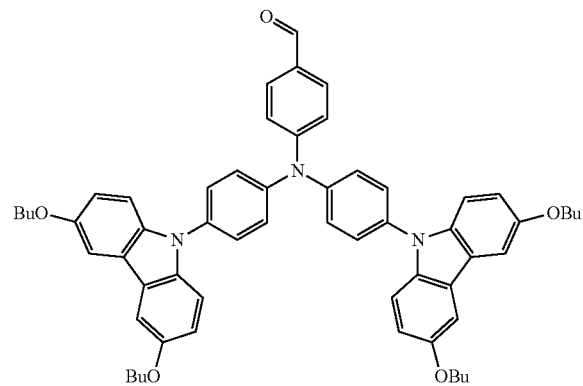

9.00 g (3) (29.0 mmol, 2.4 eq), 6.30 g 4-(bis(4-iodophenyl)amino)benzaldehyde (29.0 mmol, 1.00 eq), 1.60 g copper bronze (25.0 mmol, 2.10 eq), 0.63 g [18]crown-6 (2.40 mmol, 0.20 eq) and 5.00 g $K_2CO_3$ (36.0 mmol, 3.00 eq) were stirred in 30 mL dry o-dichlorobenzene at 200° C. for 24 h. Then, the reaction mixture was diluted with 400 mL toluene, filtered through diatomaceous earth, the filtrate was three times washed with 100 mL brine, dried over sodium sulfate and vacuum evaporated to dryness. Recrystallization from toluene afforded the desired product as a yellowish solid.

Yield: 9.00 g (10.1 mmol, 84%) $^1$H NMR (500 MHz; THF-$d_8$) [ppm] δ 9.86 (s, 1H); 7.85-7.77 (m, 2H); 7.66-7.60 (m, 8H); 7.57-7.49 (m, 4H); 7.38 (d, J=8.9 Hz, 4H); 7.32-7.26 (m, 2H); 7.00 (dd, J=8.9 and 2.4 Hz, 4H); 4.09 (t, J=6.5 Hz, 8H); 1.85-1.79 (m, 8H); 1.64-1.49 (m, 8H); 1.02 (t, J=7.4 Hz, 12H)

$^{13}$C NMR (126 MHz; CDCl$_3$) [ppm] δ 190.6; 153.7; 153.1; 144.5; 136.2; 135.2; 131.7; 130.1; 127.9; 127.3; 123.9; 120.5; 115.9; 110.7; 104.1; 68.9; 31.7; 19.5; 14.1

4-(3,6-dibutoxy-9H-carbazol-9-yl)-N-(4-(3,6-dibutoxy-9H-carbazol-9-yl)phenyl)-N-(4-vinylphenyl)aniline (5)

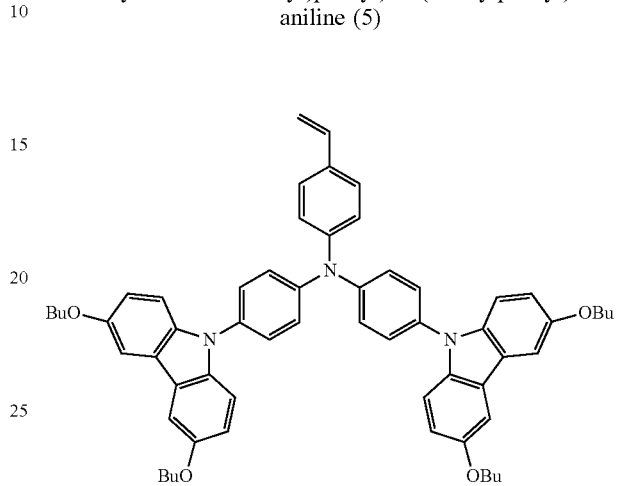

A suspension 9.60 g methyl triphenyl phosphonium bromide (26.9 mmol, 3 eq) and 2.9 g potassium tert-butoxide (26.1 mmol, 2.90 eq) in dry 1,4-dioxane has been stirred for 2 h at 0° C., then, 8.00 g 4-(bis(4-(3,6-dibutoxy-9H-carbazol-9-yl)phenyl)amino)benzaldehyde (8.97 mmol, 1.00 eq) were added in form of a solution in 200 mL dry toluene, while maintaining the temperature 0° C., the mixture has been stirred at this temperature for further 30 min, washed three times with 300 mL brine, dried over sodium sulfate, filtered and vacuum evaporated with silica. After column elution with n-heptane:toluene (1:2 v/v) and eluate evaporation, the desired product was obtained as a white solid.

Yield: 7.23 g (8.12 mmol, 91%)

$^1$H NMR (500 MHz; THF-$d_8$) [ppm] δ 7.64 (d, J=2.5 Hz, 4H); 7.56-7.46 (m, 10H); 7.46-7.41 (m, 4H); 7.36 (d; J=8.9 Hz, 4H); 7.31-7.27 (m, 4H); 7.02 (dd, J=8.9 and 2.4 Hz, 4H); 6.75 (dd, J=17.6 and 10.9 Hz, 1H); 5.75 (d, J=17.6 Hz, 1H); 5.19 (d, J=11.0 Hz, 1H); 4.10 (t, J=6.5 Hz, 8H); 1.87-1.82 (m, 8H); 1.62-1.54 (m, 8H); 1.04 (t, J=7.4 Hz, 12H)

$^{13}$C NMR (126 MHz, chloroform-d) [ppm] δ 153.4; 146.9; 146.0; 136.3; 133.0; 132.9; 129.0; 128.2; 127.6; 127.4; 124.9; 124.5; 123.5; 115.7; 110.6; 103.9; 68.8; 31.6; 19.4; 13.9

Typical Co-Polymerization Procedures.

Poly(4-(3,6-dibutoxy-9H-carbazol-9-yl)-N-(4-(3,6-dibutoxy-9H-carbazol-9-yl)phenyl)-N(4-vinylphenyl)aniline)$_{50}$-ran-(1-(azidomethyl)-4-vinylbenzene)$_{50}$] (PPF1)

0.50 eq 4-(3,6-dibutoxy-9H-carbazol-9-yl)-N-(4-(3,6-dibutoxy-9H-carbazol-9-yl)phenyl)-N(4-vinylphenyl)aniline (5) and 0.50 eq 1-(azidomethyl)-4-vinylbenzene (1) were stirred with 0.02 eq azo-bis(isobutyronitrile) (AIBN) in toluene at overall mass concentration 0.1 g/mL for 72 h at 50° C., cooled to RT and the resulting polymer was precipitated from n-heptane:ethyl acetate 4:1 v/v mixture. The precipitate was collected using a PTFE filter (20 μm porosity), dried dissolved in toluene to a solution having mass concentration 0.05 g/mL and reprecipitated. After drying, the desired product was obtained as a white solid in 61% yield.

$^1$H NMR (500 MHz, chloroform-d) [ppm] δ 7.85-6.15 (aromatic); 4.29-3.40 (alkoxy, benzylic); 2.48-0.55 (aliphatic+backbone); monomer ratio $^1$H-NMR: (m=50, n=50); $T_g$=160° C.; $M_w$=25.0 kg mol$^{-1}$; $M_n$ =12.2 kg mol$^{-1}$
Poly(4-(3,6-dibutoxy-9H-carbazol-9-yl)-N-(4-(3,6-dibutoxy-9H-carbazol-9-yl)phenyl)-N(4-vinylphenyl)aniline)$_{57}$-ran-(1-(prop-2-in-1-yloxy)-4-vinylbenzene)$_{43}$] (PPF2)

0.50 eq 4-(3,6-dibutoxy-9H-carbazol-9-yl)-N-(4-(3,6-dibutoxy-9H-carbazol-9-yl)phenyl)-N(4-vinylphenyl)aniline (5) and 0.50 eq 1-(propargyloxy)-4-vinylbenzene (2) were stirred with 0.02 eq azo-bis(isobutyronitrile) (AIBN) in toluene at overall mass concentration 0.1 g/mL for 72 h at 50° C., cooled to RT and the resulting polymer was precipitated from n-heptane:ethyl acetate 4:1 v/v mixture. The precipitate was collected using a PTFE filter (20 μm porosity), dried, dissolved in toluene to a solution having mass concentration 0.05 g/mL and reprecipitated. After drying, the desired product was obtained as a white solid in 66% yield.

$^1$H NMR (500 MHz, chloroform-d) [ppm] δ 7.85-6.15 (aromatic); 4.29-3.40 (alkoxy; benzylic); 2.48-0.55 (aliphatic+backbone); monomer ratio $^1$H-NMR: (m=57, n=43);
$T_g$=160° C.; $M_w$=14.1 kg mol$^{-1}$; $M_n$ =9.28 kg mol$^{-1}$.

Conductivity and Stability of a Doped Crosslinked Layer

An anisole solution containing 1.74 wt % of the first precursor charge-transporting polymer PPF1, 0.75 wt % p-dopant PR-1 and 2.02 wt % the second precursor charge-transporting polymer PPF2 was prepared and spin-coated on ITO substrate for 30 s at 1000 rpm. The mass ratio PPF1:PPF2 8.6:10 corresponds to molar ratio between azide and acetylene crosslinking units 1:1. After drying and baking on hot plate in nitrogen atmosphere for 30 min at 180° C., conductivity and UV absorbance of the formed thin film at the wavelengths 340 nm (characteristic for charge transport structural moieties of the polymer) and 540 nm (characteristic absorption band of the active state of the p-dopant) were measured.

The formed film was spin-rinsed with toluene after 10 s soaking-time before spinning After 30 min drying at 80° C., the conductivity and UV absorbance were measured again.

The experiment was repeated with mass ratio PPF1:PPF2 2.9:10 which corresponds to molar ratio between azide and acetylene crosslinking units 1:3, and with precursor polymers PP3 and PP4 of the previous application WO2014/037512, in the same molar ratios 1:1 and 1:3 between the azide-substituted and the acetylene-substituted crosslinking units in both precursor polymers as in the above example.

Whereas the observed conductivities in the range $10^{-5}$-$10^4$ S·cm$^{-1}$ confirmed the applicability of the tested material for charge transport, from the relative changes in polymer and dopant absorbance, the stability of the layer in terms of the polymer wash-off and dopant wash-out can be estimated from the effect of the rinsing on the crosslinked layer.

The results further amended with estimation of relative change in dopant absorbance after long-term illumination of the deposited layer with blue light are summarized in Table 1

TABLE 1

| Material (molar ratio of azide and acetylene crosslinking units given) | Dopant wash-out % | Polymer wash-off % | Dopant deterioration by blue light % |
|---|---|---|---|
| PPF1:PPF2 1:3 | 11 | 2.0 | 6.0 |
| PPF1:PPF2 1:1 | 0.3 | 1.0 | 0.1 |
| PP3:PP4 1:3 | 0.3 | 0.1 | 8.3 |

Table 1 shows different behaviour of crosslinked semiconducting materials of present invention in comparison with materials of previous application. The results demonstrate that in materials of present application, better fit between processing stability of the crosslinked semiconducting layer and its operational stability can be achieved.

Bottom Emission Blue OLED

On 90 nm thick indium tin oxide (ITO) layer fabricated on a glass substrate, 50 nm thick crosslinked hole-transporting layer from PPF1 and PPF2 in weight ratio doped with 20 wt. % PR1 based on the overall polymer weight was cast by spin-coating from 2 wt. % tolueneanisole solution. After drying and baking in an inert atmosphere at 180° C. for 40 minutes, a doped crosslinked layer having thickness 40 nm was obtained. Following layers were prepared on top of the crosslinked layer by vacuum deposition: 90 nm undoped electron blocking layer composed from $N^4,N^{4'''}$-di(naphtalen-1-yl)-$N^4,N^{4'''}$-diphenyl-[1,1':4',1''-terphenyl]-4,4''-diamine, 20 nm blue fluorescent emitting layer composed of ABH113 (obtained from Sun Fine Chem (SFC), Korea) doped with NUBD370 (also from SFC, host:emitter ratio 95:5 by weight), 30 nm electron transporting layer composed of 2-(4-(9,10-di(naphtalen-2-yl)anthracen-2-yl)phenyl)-1-phenyl-1H-benzo[d]imidazole (CAS 561064-11-7) and lithium 8-hydroxyquinolinolate (CAS 850918-68-2) in weight ratio 1:1 and 100 nm thick Al cathode. At current density 15 mA/cm$^2$, the OLED had operational voltage 4.8 V, quantum efficiency 5.2% and current efficiency 5.5 cd/A (see also FIGS. 1 and 2). The lifetime of the OLED, expressed as LT97 (the time necessary for luminance decrease to 97% of its initial value), was 60 hours.

The results are summarized in table 2.

TABLE 2

| material | V @ 15 mA/cm$^2$ (V) | Qeff @ 15 mA/cm$^2$ (%) | CiEy | LT97 @ 15 mA/cm$^2$ | Operational stability |
|---|---|---|---|---|---|
| PPF1:PPF2 1:1 | 4.8 | 5.2% | 0.11 | 60 h | yes |
| PP3:PP4 1:1 | 5.7 | 5.7% | 0.09 | — | no |
| PP3:PP4 1:3 | 5.5 | 6.1% | 0.09 | 30 h | yes |

These results confirm that whereas all crosslinked p-doped materials exhibit sufficient conductivity and negligible polymer wash-off and dopant wash-out, they differ in their OLED device performance, especially in terms of lifetime and operational stability. It appears that whereas the crosslinked polymer of the previous application which is formed from precursor polymers having tough backbone requires a stoichiometric excess of acetylenic groups over complementary azide groups (see in Table 1, e.g. better polymer wash-off and dopant wash-out at 3:1 molar ratio), more flexible polymers of the present invention enable that the best cross-linking is achieved if the stoichiometric ratio between the complementary groups is set around 1:1, the value which is optimal for OLED operational stability.

This unexpected result enables designing crosslinked p-doped materials with very low content of residual unreacted crosslinking groups. Consequently, cross-linked p-doped materials according to present invention enable designing electronic devices with high reproducibility and favourable stability of their luminance and operational voltage at constant operational current density.

Figure 2:
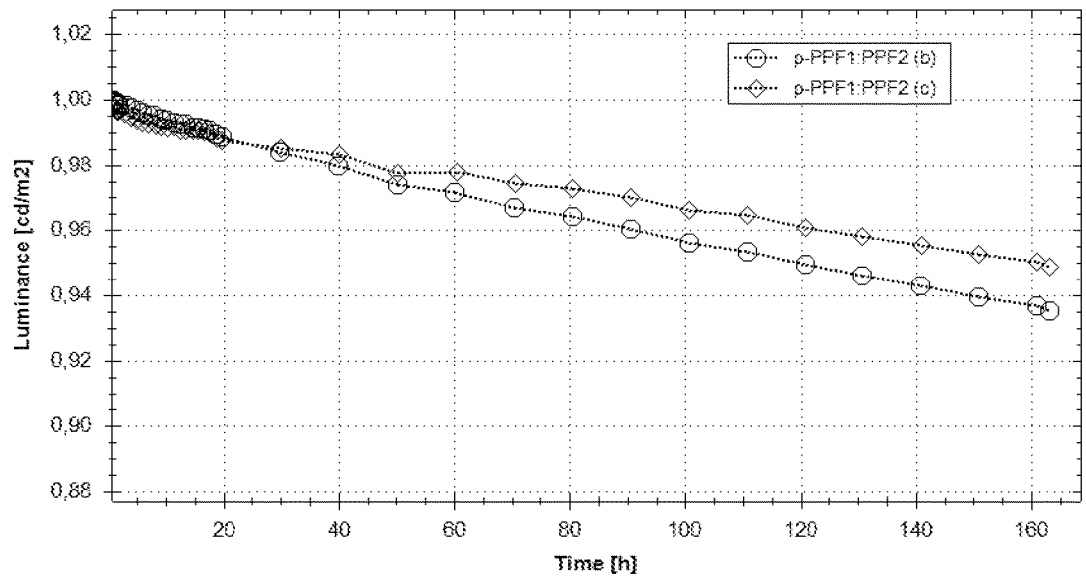
FIG. 2: Graph of luminance of the blue OLED in dependence on time.

FIGS. 1 and 2 compare current-voltage characteristics and lifetime of the blue OLED prepared in the example above (curve (c), circles) and the same OLED prepared under stress conditions of the HTL baking prolonged to 120 minutes (curve (b), rhombi). The results show robustness of the inventive doped material, wherein on expense of slightly higher operational voltage, efficiency and device-lifetime can be further increased by prolonged heat treatment of the doped layer, without a substantial change in spectral characteristics of the device.

The results demonstrate that a crosslinked charge transporting layer comprising semiconducting material according to the invention can be successfully used in organic electronic devices.

The features disclosed in the foregoing description may, both separately and in any combination thereof, be material for realizing various embodiments of the invention which is generically defined in the independent claims.

What is claimed is:

1. A charge transporting semi-conducting material comprising:
    a) optionally at least one electrical dopant, and
    b) a branched or cross-linked charge transporting polymer comprising 1,2,3-triazole cross-linking units of at least one of the general formulae Ia and/or Ib,

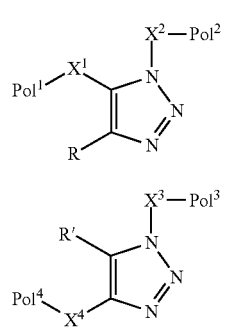

wherein
   aa) $Pol^1$-$Pol^4$ are independently selected chains of the charge-transporting polymer,
   bb) $X^1$, $X^2$, $X^3$, and $X^4$ are independently selected spacer units or, independently, represent direct bonding of $Pol^1$-$Pol^4$ to the 1,2,3-triazole ring,
   cc) each of R and R' is independently selected from H, halogen, or a carbon-containing group,
wherein the charge transporting polymer comprises ethylene building units substituted with at least one pending side group comprising a conjugated system of delocalised electrons,
the charge transporting semi-conducting material being obtainable by a process comprising:
   i) providing a solution containing
      aaa) a first precursor charge transporting polymer comprising at least one covalently attached azide group and optionally at least one acetylenic group; and/or a second precursor charge transporting polymer comprising at least one covalently attached acetylenic group and optionally at least one azide group; and optionally at least one crosslinking agent comprising at least two functional groups selected from azide and/or acetylenic group,
      bbb) optionally at least one electrical dopant,
      ccc) at least one solvent,
   ii) depositing the solution on a substrate,
   iii) removing the solvent, and
   iv) reacting the azide and acetylenic groups to effect crosslinking,
wherein at least one of the first and second precursor charge transporting polymer comprises ethylene building units substituted with at least one pending side group comprising a conjugated system of delocalised electrons.

2. Charge transporting semi-conducting material according to claim 1, wherein the average number of azide and/or acetylenic groups per molecule in each of the first precursor charge transporting polymer, the second precursor charge transporting polymer, and the crosslinking agent is greater than 2.

3. Charge transporting semi-conducting material according to claim 1, wherein, in the pending side group, the conjugated system of delocalized electrons is comprised in a carbocyclic or heterocyclic structural moiety.

4. Charge transporting semi-conducting material according to claim 3, wherein the conjugated system of delocalized electrons comprised in the carbocyclic or heterocyclic structural moiety is aromatic.

5. Charge transporting semi-conducting material according to claim 4, wherein the pending side group comprises at least two rings which are independently selected from aromatic and heteroaromatic rings.

6. Charge transporting semi-conducting material according to claim 1, wherein the pending side group comprises at least one trivalent nitrogen atom.

7. Charge transporting semi-conducting material according to claim 6, wherein the trivalent nitrogen atom is substituted with three carbocyclic or heterocyclic rings which are independently selected from aromatic and heteroaromatic rings.

8. Charge transporting semi-conducting material according to claim 6, wherein the pending side group is selected from

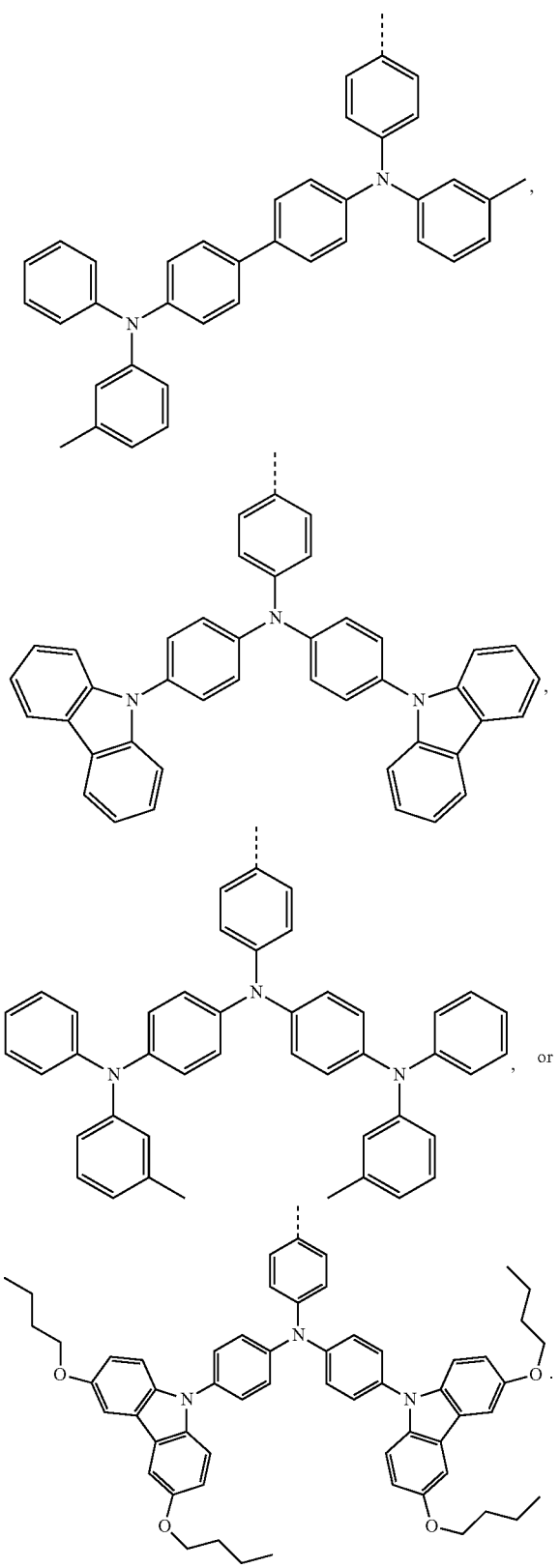

9. Charge transporting semi-conducting material according to claim 1, wherein the electrical dopant is a p-dopant.

10. Charge transporting semi-conducting material according to claim 1, wherein the electrical dopant is selected from [3]-radialene compounds, wherein each bridgehead carbon atom is substituted by a nitrile group, $C_6$-$C_{14}$ perfluorinated aryl, or $C_2$-$C_{14}$ perfluorinated heteroaryl, wherein up to three fluorine atoms in the perfluorinated substituents may optionally be replaced by groups independently selected from nitrile or trifluoromethyl.

11. Charge transporting semi-conducting material according to claim 1, wherein the step of reacting the azide and acetylenic groups comprises heating.

12. Charge transporting semi-conducting material according to claim 1, wherein the average number of azide and/or acetylenic groups per molecule in each the first precursor charge transporting polymer, the second precursor charge transporting polymer and the crosslinking agent is greater than 2.05.

13. An electronic device comprising a semi-conducting layer comprising the charge transporting semi-conducting material according to claim 1.

14. A process for preparing the charge transporting semi-conducting material according to claim 1, comprising the steps of:
   i) providing a solution comprising
      a) a first precursor charge-transporting polymer comprising at least one covalently attached azide group and optionally at least one acetylenic group; and/or a second precursor charge-transporting polymer comprising at least one covalently attached acetylenic group and optionally one azide group; and optionally at least one crosslinking agent comprising at least two functional groups selected from azide and/or acetylenic group,
      b) optionally at least one electrical dopant,
      c) at least one solvent,
   ii) depositing the solution on a substrate,
   iii) removing the solvent, and
   iv) reacting the azide and acetylenic groups to effect crosslinking,
   wherein at least one of the first and second precursor charge transporting polymer comprises ethylene building units substituted with at least one pending side group comprising a conjugated system of delocalized electrons.

15. The process for preparing the charge transporting semi-conducting material according to claim 14, wherein the step of reacting the azide and acetylenic groups comprises heating.

16. A branched or cross-linked charge transporting polymer comprising 1,2,3-triazole cross-linking units of at least one of the general formulae Ia and/or Ib,

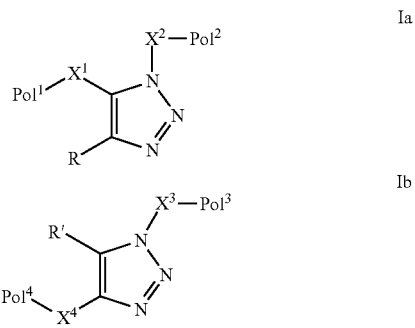

wherein
- aa) Pol¹-Pol⁴ are independently selected chains of the charge-transporting polymer,
- bb) X¹, X², X³, and X⁴ are independently selected spacer units or, independently, represent direct bonding of Pol¹-Pol⁴ to the 1,2,3-triazole ring,
- cc) each of R and R' is independently selected from H, halogen or a carbon-containing group, wherein the charge transporting polymer comprises ethylene building units substituted with at least one pending side group comprising a conjugated system of delocalised electrons, and wherein the charge transporting polymer comprises at least one covalently attached azide group and optionally at least one acetylenic group.

17. The branched or cross-linked charge transporting polymer according to claim 16, wherein, in the pending side group, the conjugated system of delocalized electrons is comprised in a carbocyclic or heterocyclic structural moiety.

18. The branched or cross-linked charge transporting polymer according to claim 17, wherein the conjugated system of delocalized electrons comprised in the carbocyclic or heterocyclic structural moiety is aromatic.

19. The branched or cross-linked charge transporting polymer according to claim 18, wherein the pending side group comprises at least two rings which are independently selected from aromatic and heteroaromatic rings.

20. The branched or cross-linked charge transporting polymer according to claim 16, wherein the pending side group comprises at least one trivalent nitrogen atom.

21. The branched or cross-linked charge transporting polymer according to claim 20, wherein the trivalent nitrogen atom is substituted with three carbocyclic or heterocyclic rings which are independently selected from aromatic and heteroaromatic rings.

22. The branched or cross-linked charge transporting polymer according to claim 20, wherein the pending side group is selected from

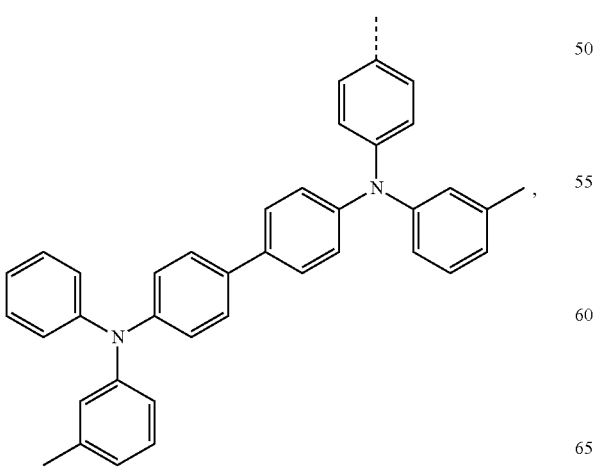

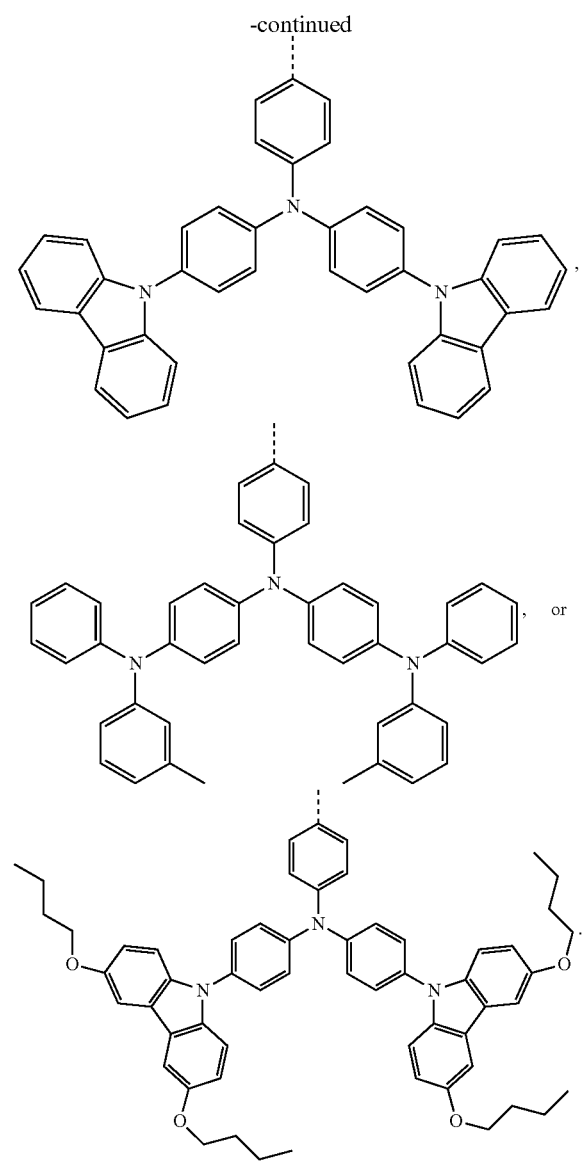

23. A branched or cross-linked charge transporting polymer comprising 1,2,3-triazole cross-linking units of at least one of the general formulae Ia and/or Ib,

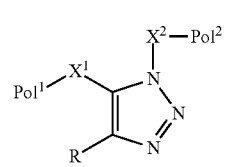

Ia

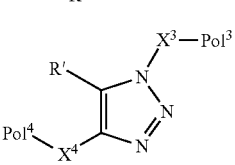

Ib wherein
- aa) Pol¹-Pol⁴ are independently selected chains of the charge-transporting polymer,
- bb) X¹, X², X³, and X⁴ are independently selected spacer units or, independently, represent direct bonding of Pol¹-Pol⁴ to the 1,2,3-triazole ring, cc) each of R and R' is independently selected from H, halogen or a carbon-containing group, wherein the charge transporting polymer comprises ethylene building units substituted with at least one pending side group comprising a conjugated system of delocalised electrons, and wherein the charge transporting polymer comprises at least one covalently attached acetylenic group and optionally at least one azide group.

24. The branched or cross-linked charge transporting polymer according to claim 23, wherein, in the pending side group, the conjugated system of delocalized electrons is comprised in a carbocyclic or heterocyclic structural moiety.

25. The branched or cross-linked charge transporting polymer according to claim 24, wherein the conjugated system of delocalized electrons comprised in the carbocyclic or heterocyclic structural moiety is aromatic.

26. The branched or cross-linked charge transporting polymer according to claim 25, wherein the pending side group comprises at least two rings which are independently selected from aromatic and heteroaromatic rings.

27. The branched or cross-linked charge transporting polymer according to claim 23, wherein the pending side group comprises at least one trivalent nitrogen atom.

28. The branched or cross-linked charge transporting polymer according to claim 27, wherein the trivalent nitrogen atom is substituted with three carbocyclic or heterocyclic rings which are independently selected from aromatic and heteroaromatic rings.

29. The branched or cross-linked charge transporting polymer according to claim 27, wherein the pending side group is selected from

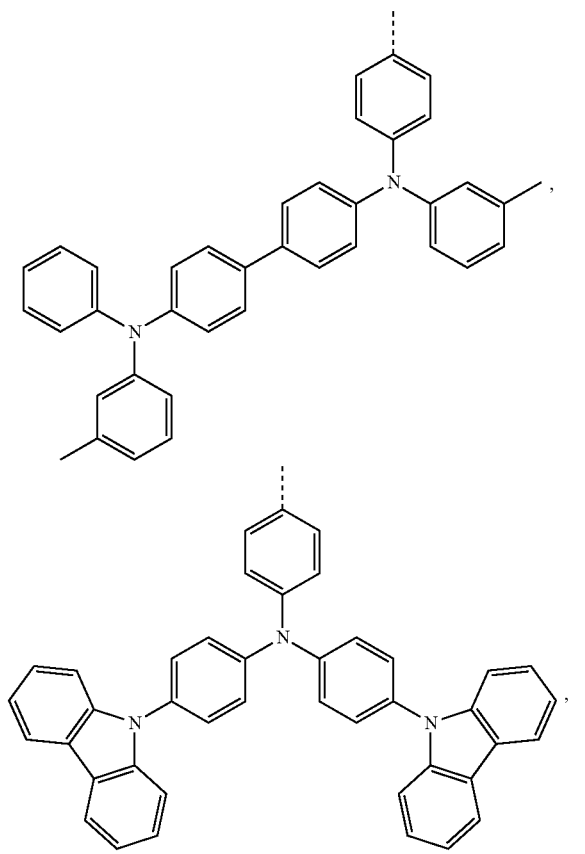

-continued

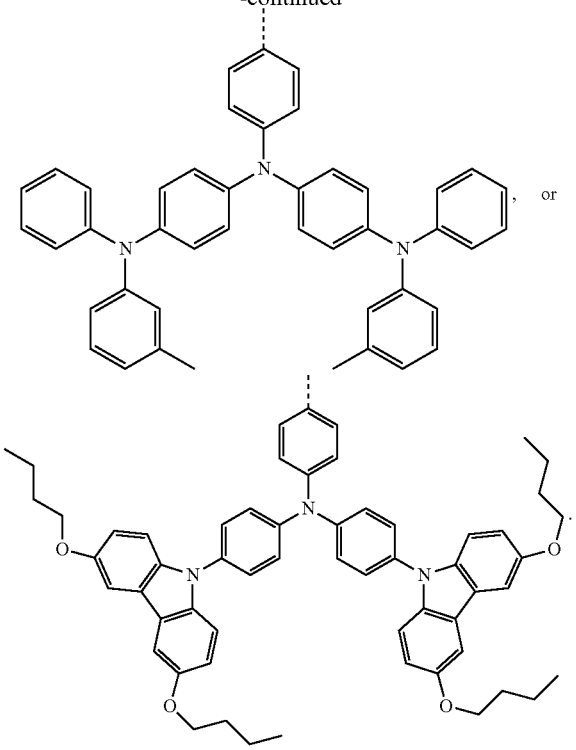

, or

30. A cross-linked charge transporting polymer comprising 1,2,3-triazole cross-linking units of at least one of the general formulae Ia and/or Ib,

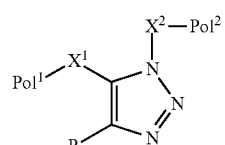

Ia

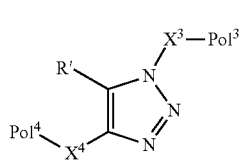

Ib wherein
aa) $Pol^1$-$Pol^4$ are independently selected chains of the charge-transporting polymer,
bb) $X^1$, $X^2$, $X^3$, and $X^4$ are independently selected spacer units or, independently, represent direct bonding of $Pol^1$-$Pol^4$ to the 1,2,3-triazole ring,
cc) each of R and R' is independently selected from H, halogen or a carbon-containing group, and wherein the charge transporting polymer comprises ethylene building units substituted with at least one pending side group comprising a conjugated system of delocalised electrons.

31. A solution, the solution comprising
a) a first precursor charge-transporting polymer comprising at least one covalently attached azide group and optionally at least one acetylenic group; and/or a second precursor charge-transporting polymer comprising at least one covalently attached acetylenic group and optionally one azide group; and optionally at least one crosslinking agent comprising at least two functional groups selected from azide and/or acetylenic group, b) at least one electrical dopant, and c) at least one solvent, wherein the first precursor charge-transporting polymer and the second precursor charge-transporting polymer are independently selected from those capable of reacting to form a cross-linked charge transporting polymer comprising 1,2,3-triazole cross-linking units of at least one of the general formulae Ia and/or Ib,

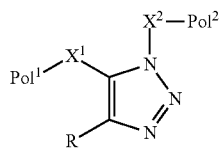

Ia

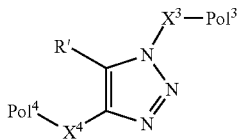

Ib wherein aa) $Pol^1$-$Pol^4$ are independently selected chains of the charge-transporting polymer, bb) $X^1$, $X^2$, $X^3$, and $X^4$ are independently selected spacer units or, independently, represent direct bonding of $Pol^1$-$Pol^4$ to the 1,2,3-triazole ring, cc) each of R and R' is independently selected from H, halogen or a carbon-containing group, and wherein at least one of the first and second precursor charge transporting polymer comprises ethylene building units substituted with at least one pending side group comprising a conjugated system of delocalized electrons and the solvent comprises at least 1 wt % of a nitrile compound.

* * * * *